(12) United States Patent
Sugihara et al.

(10) Patent No.: US 7,569,917 B2
(45) Date of Patent: Aug. 4, 2009

(54) SEMICONDUCTOR DEVICE

(75) Inventors: Masahiko Sugihara, Miyazaki (JP); Fumihiko Ooka, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/798,989

(22) Filed: May 18, 2007

(65) Prior Publication Data
US 2007/0284707 A1 Dec. 13, 2007

(30) Foreign Application Priority Data
Jun. 7, 2006 (JP) .............................. 2006-158900

(51) Int. Cl.
*H01L 23/495* (2006.01)
(52) U.S. Cl. ..................... 257/668; 439/60; 439/43; 439/924.1; 438/125; 257/E23.01; 257/E23.012
(58) Field of Classification Search ................ 257/668, 257/E23.01, E23.012; 439/60, 924.1, 43, 439/55; 438/125
See application file for complete search history.

(56) References Cited
U.S. PATENT DOCUMENTS
5,825,081 A * 10/1998 Hosomi et al. .............. 257/668

5,949,512 A * 9/1999 Taguchi ..................... 349/150
6,056,573 A * 5/2000 Nishioka .................... 439/326
6,464,540 B1 * 10/2002 Sato .......................... 439/668

FOREIGN PATENT DOCUMENTS
JP 03-276737 12/1991

* cited by examiner

*Primary Examiner*—Sue Purvis
*Assistant Examiner*—Tucker Wright
(74) *Attorney, Agent, or Firm*—Rabin & Berdo, P.C.

(57) ABSTRACT

A semiconductor device includes a semiconductor chip, an insulating base film and first projecting electrodes. The first projecting electrodes are formed in a single row on one face of the semiconductor chip along the edge of the semiconductor chip. This face of the semiconductor chip faces a semiconductor chip mounting face of the base film. The semiconductor device also includes second projecting electrodes formed in a single row outside the row of first projecting electrodes. The height of the second projecting electrodes is smaller than the first projecting electrodes. The semiconductor device also includes first inner leads formed on the semiconductor chip mounting face of the base film. The first inner lead extend to the first projecting electrodes. The semiconductor device also includes an insulating film formed between the first inner leads and the semiconductor chip. The semiconductor device also includes second inner leads formed on the insulating film. The second inner lead extend to the second projecting electrodes.

14 Claims, 8 Drawing Sheets

FIG. 6A (P1)
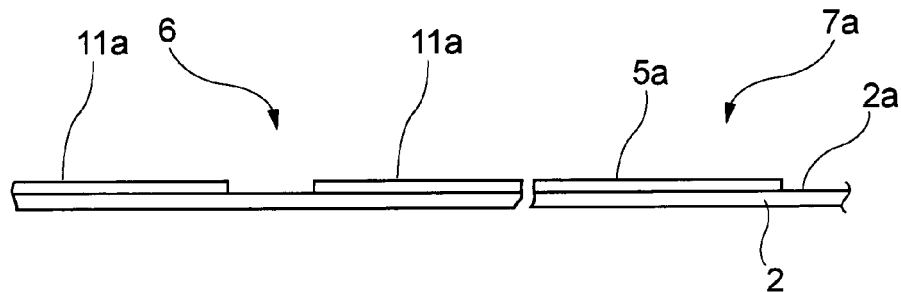
FIG. 6B (P2)
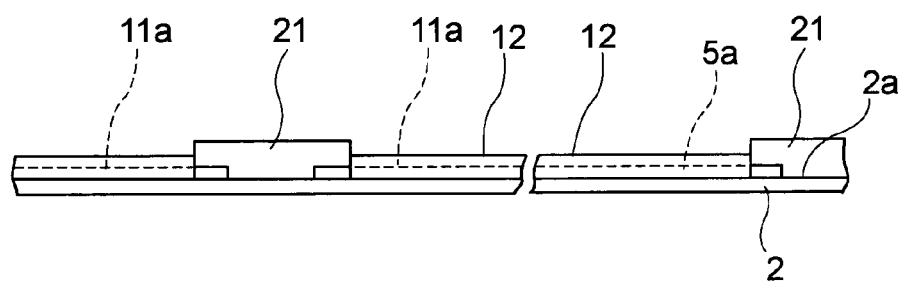
FIG. 6C (P3)
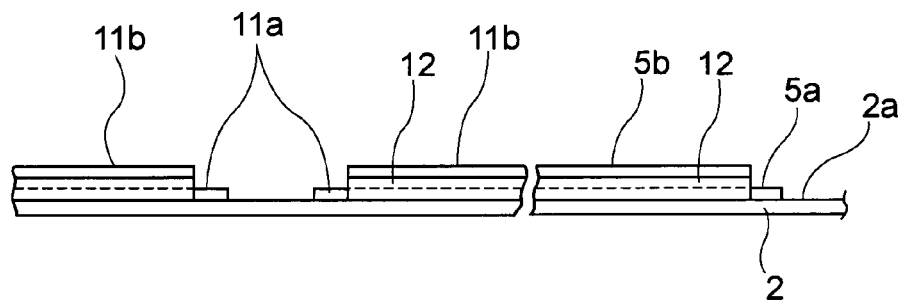
FIG. 6D (P4)
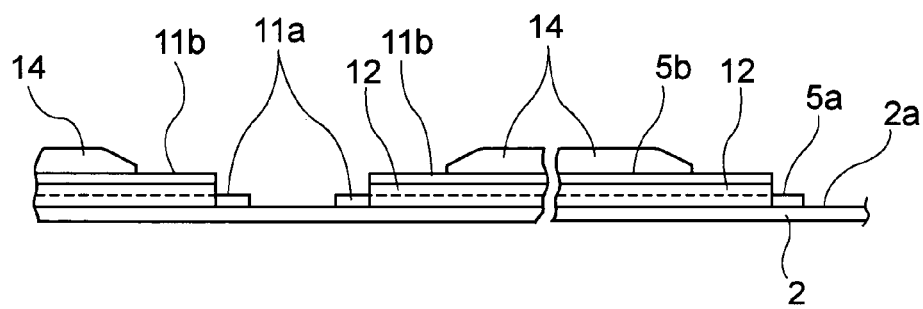

FIG. 7A (PA1)
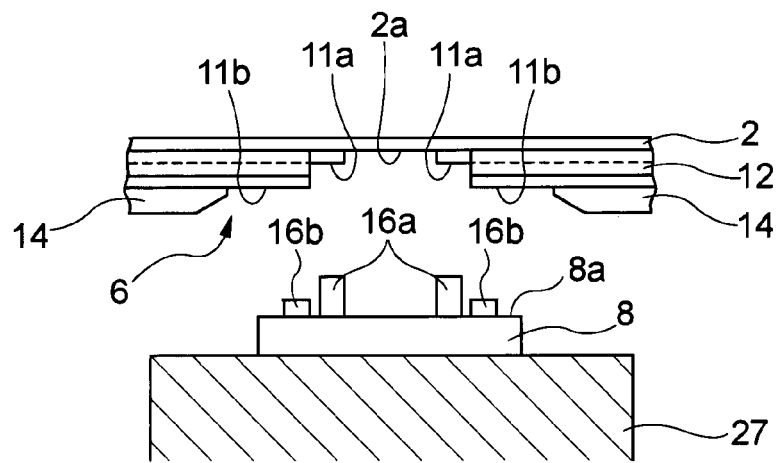
FIG. 7B (PA2)
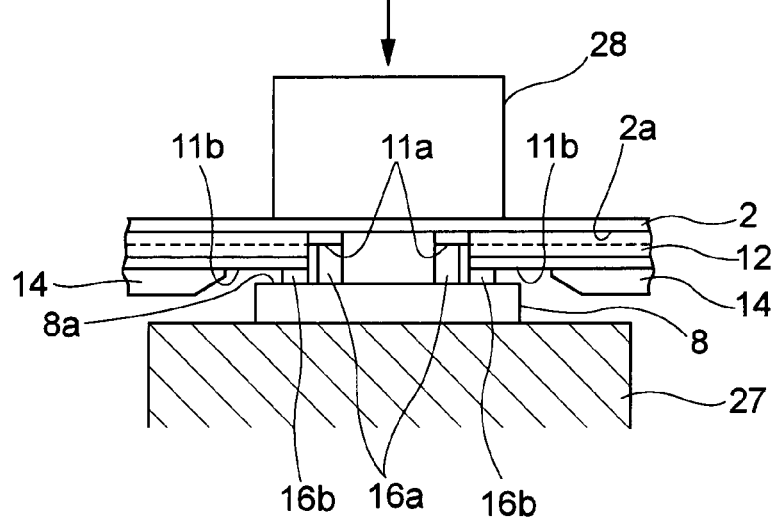
FIG. 7C (PA3)
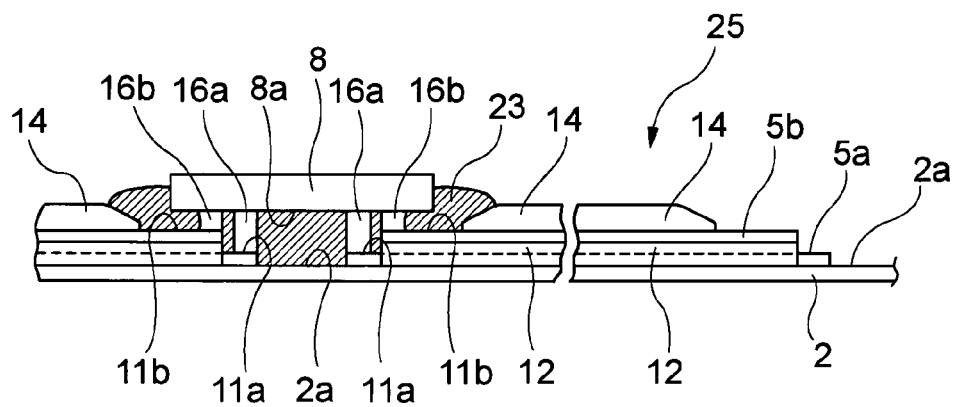

SEMICONDUCTOR DEVICE

BACKGROUND OF THE INVENTION

1. Field of the Invention

The present invention relates to a semiconductor device of the TCP (tape carrier package) type that is continuously manufactured from a tape carrier having semiconductor chips mounted thereon.

2. Description of the Related Art

In recent years, more integration of semiconductor chips mounted on a tape carrier is demanded, and the number of projecting electrodes that are formed on the semiconductor chips are increasing. Accordingly, the number of inner leads formed on the tape carrier is also increasing. If the inner leads and outer leads are arranged with certain intervals in order to avoid short-circuiting between adjacent inner leads and between adjacent outer leads, the size of the semiconductor device becomes large.

If the width of the inner leads and outer leads is reduced in order to reduce the size of the semiconductor device, the strength of the inner leads and outer leads themselves is lowered, the strength of adhesion with the projecting electrodes of the semiconductor chip is lowered, and the strength of adhesion with the wiring terminals of the mounting circuit substrate is reduced.

In order to deal with the problems, a conventional TCP type semiconductor device has the following structure and meets the demand for increased circuit integration of the semiconductor chip. Copper foil is adhesively laminated on the front and rear surfaces of an insulating base film made for example of polyimide, and inner leads are formed on both faces of the base film by patterning by means of etching the copper foil. The inner leads formed on the rear face are directly joined with projecting electrodes formed in a single row on the outer face of the semiconductor chip by hot pressure fixing. The inner leads formed on the front face and the projecting electrodes formed in a single row on or near the middle of the semiconductor chip are joined by wire bonding (see for example Japanese Patent Application Kokai (Laid Open) No. H. 3-276737, in particular the lower left column in page 2 and FIG. 1).

In the prior art described above, the inner leads formed on the rear face and the projecting electrodes formed on the outer face of the semiconductor chip are directly joined by hot pressure fixing, and the inner leads formed on the front face and the projecting electrodes formed in the middle of the semiconductor chip are joined by wire bonding. Thus, the step of joining the inner leads with the projecting electrodes of the semiconductor chip in the TCP-type semiconductor device manufacturing process is divided into a joining step using hot pressure fixing and another joining step using wire bonding. It is therefore necessary to install equipment for the wire bonding and to ensure sufficient space for this installation.

SUMMARY OF THE INVENTION

One object of the present invention is to provide a semiconductor device which can simplify the step of joining the projecting electrodes with the inner leads of a semiconductor chip having a high degree of circuit integration.

According to one aspect of the present invention, there is provided a semiconductor device that includes a semiconductor chip and an insulating base film. The insulating base film has a semiconductor chip mounting face, which faces a first face of the semiconductor chip. The semiconductor device also includes a plurality of first projecting electrodes. The first projecting electrodes are formed in a row or rectangle on the first face of the semiconductor chip along the edge(s) of the semiconductor chip. The semiconductor device also includes a plurality of second projecting electrodes formed in a second row or rectangle on the first face of the semiconductor chip along the edge(s) of the semiconductor chip. The second projecting electrodes are located between the edge(s) of the semiconductor chip and the first row of first projecting electrodes. The height of the second projecting electrode is smaller than the height of the first projecting electrode. The semiconductor device also includes a plurality of first inner leads extending on the semiconductor chip mounting face of the base film such that the first inner leads reach the first projecting electrodes respectively. The semiconductor device also includes an insulating film between the first inner leads and the first face of the semiconductor chip. The semiconductor device also includes a plurality of second inner leads extending between the insulating film and the first face of the semiconductor chip such that the second inner leads reach the second projecting electrodes respectively.

The first projecting electrodes of the semiconductor chip can be aligned with the first inner leads on the base film while the second projecting electrodes of the semiconductor chip are aligned with the second inner leads on the base film. Therefore, the first and second projecting electrodes can be joined with the first and second inner leads simultaneously. In other words, the semiconductor device manufacturing process needs only one joining step. Accordingly, the manufacturing process for a semiconductor device having a semiconductor chip of a high degree of circuit integration thereon can be simplified.

BRIEF DESCRIPTION OF THE DRAWINGS

FIGS. 6A to 6D are a series of diagrams showing a method of manufacturing the tape carrier according to Embodiment 1;

FIGS. 7A to 7C are a series of diagrams showing a method of manufacturing a semiconductor device according to Embodiment 1;

DETAILED DESCRIPTION OF THE INVENTION

Embodiments of a semiconductor device according to the present invention are described below with reference to the drawings.

Embodiment 1

Embodiment 1 is described with reference to FIGS. 1 to 7. It should be noted that FIGS. 1 and 2 show a condition in which the solder resist is removed.

Figure 1:
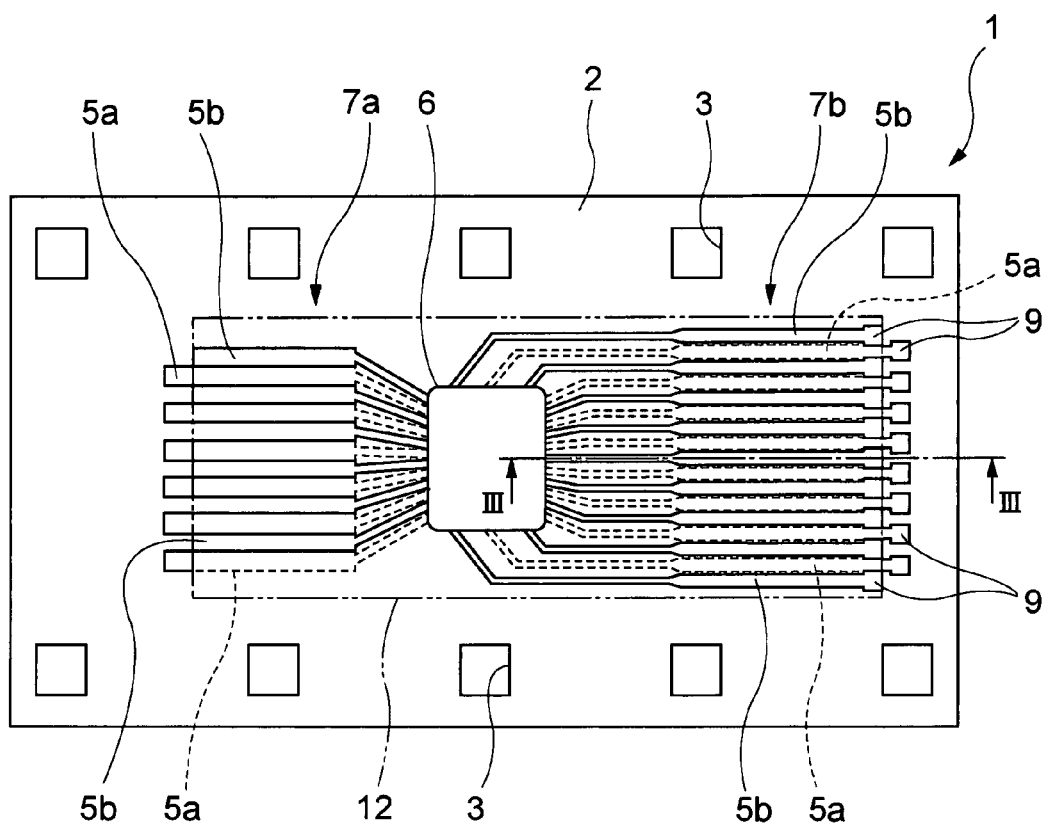
FIG. 1 shows a top face of a tape carrier according to Embodiment 1 of the present invention.
Figure 2:
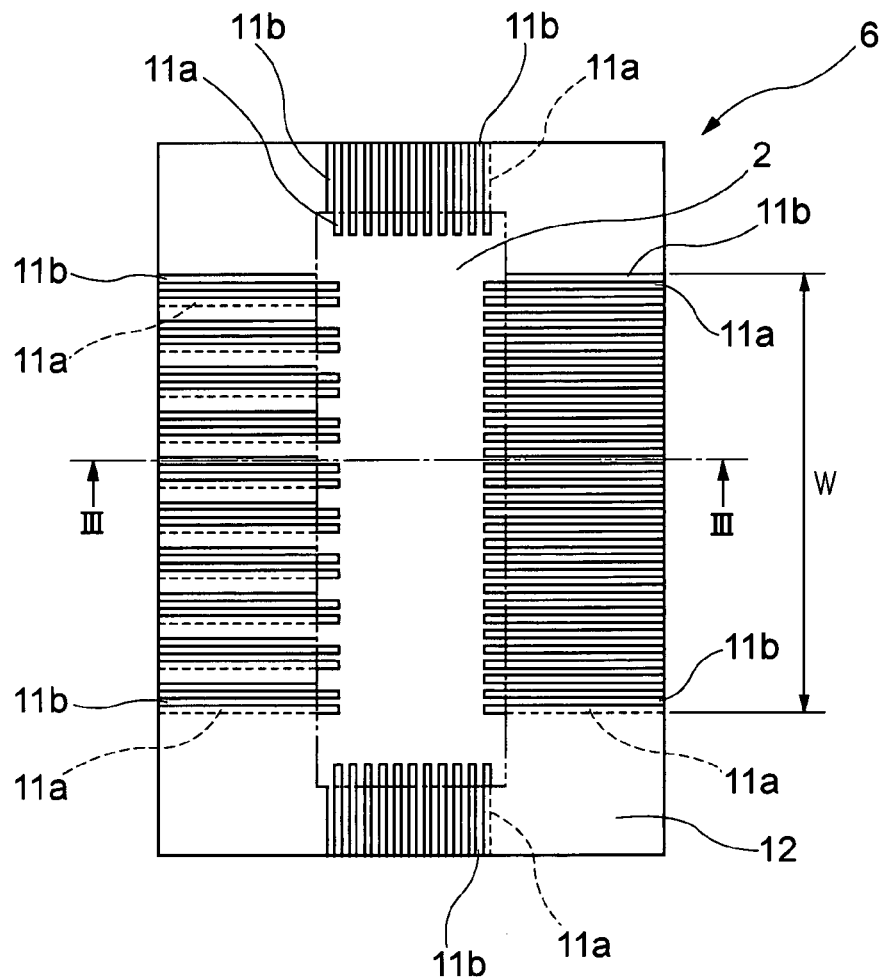
FIG. 2 illustrates a top view of an inner lead forming region according to Embodiment 1.

In FIG. 1, reference numeral 1 designates a tape carrier, and reference 2 designates a base film. The base film 2 is an elongate film member made of resin material such as polyimide having resistance to heat and insulating properties. In an edge region on each of two opposite sides of the base film 2, sprocket holes 3 are arranged in a single row with a prescribed pitch to engage with teeth of an associated sprocket wheel (not shown). Two sprocket wheels are actuated by a drive device (not shown) and engage with the sprocket holes 3 on both sides of the base film 2 to achieve the moving and positioning of the tape carrier 1.

First and second outer leads 5a and 5b are occasionally referred to as "outer leads 5" when there is no need to distinguish between them. The first and second outer leads 5a and 5b are wirings made of conductive material such as copper (Cu) and formed in outer lead forming regions 7a, 7b. The outer lead forming regions 7a, 7b are arranged on both sides of the inner lead forming region 6. The first and second outer leads 5a, 5b in the left outer lead forming region 7a are used as input terminals to a semiconductor chip 8 (see FIGS. 4 and 5), while the first and second outer leads 5a, 5b in the right outer lead forming region 7b are used as output terminals from the semiconductor chip 8.

Pads 9 are formed at the tips of the first and second outer leads 5a, 5b.

As shown in FIG. 2, first and second inner leads 11a, 11b are formed at the peripheral edges of the inner lead forming region 6. As understood from FIG. 1, the first and second inner leads 11a and 11b are respectively connected with the prescribed (or associated) first and second outer leads 5a, 5b. The first and second inner leads 11a, 11b are occasionally referred to as "inner leads 11" when there is no need to distinguish between them.

The first and second inner leads 11a, 11b and the first and second outer leads 5a, 5b in this embodiment are formed as two layers on the face (called the chip-mounting face 2a) of the base film 2 where the semiconductor chip 8 is mounted, and the insulating film 12 (shown by a double-dotted chain line in FIGS. 1 and 2) is interposed between these leads. The insulating film 12 is formed from an insulating material such as a polyimide, and indicated by hatching in FIG. 3. The first inner leads 11a and the first outer leads 5a that are connected with the first inner leads 11a are formed on the chip-mounting face 2a, the insulating film 12 is formed on top of the leads 11a and 5a, and the second inner leads 11b and the second outer leads 5b that are connected with the second inner leads 11b are formed on top of the insulating film 12.

Figure 3:
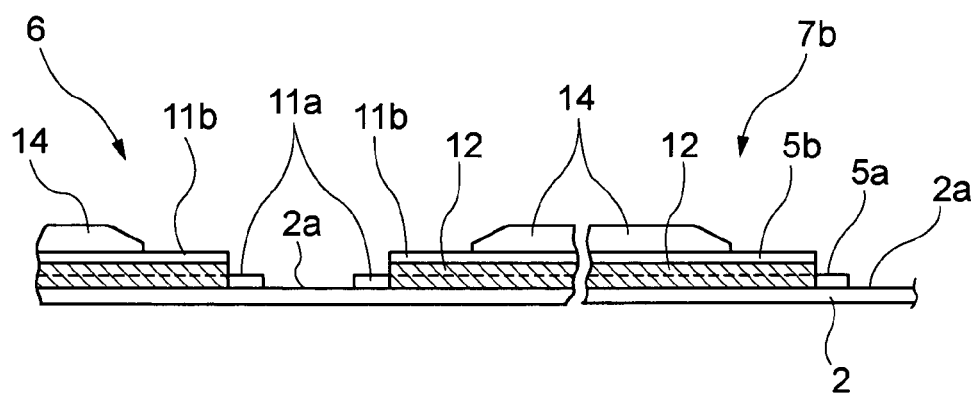
FIG. 3 is a cross-sectional view of the tape carrier taken along the line III-III in FIG. 1 or the line III-III in FIG. 2.

The tips of the first inner leads 11a extend further towards the middle of the inner lead forming region 6 than the tips of the second inner leads 11b in the upper layer, as shown in FIGS. 2 and 3. The tips of the first outer leads 5a extend (see FIG. 1 or 3) further to the outside of the inner lead forming region 6 than the tips of the second outer leads 5b in the upper layer. The first inner leads 11a and second inner leads 11b are arranged on two levels in stepped fashion, sandwiching the insulating film 12. Likewise, the first outer leads 5a and second outer leads 5b are arranged on two levels in the stepped fashion, sandwiching the insulating film 12.

The first inner leads 11a, the first outer leads 5a, the second inner leads 11b and the second outer leads 5b respectively have a width sufficient to guarantee their own strength and are arranged with a fixed separation to avoid short-circuiting with adjacent leads.

The first inner leads 11a and the second inner leads 11b of this embodiment are arranged (see FIG. 2) such that one longitudinal side of each second inner lead 11b lies in the same position above one longitudinal side of the associated (or adjacent) first inner lead 11a, and the first outer leads 5a and second outer leads 5b are arranged (see FIG. 1) such that one longitudinal side of each lead 5b lies in the same position above one longitudinal side of the associated (or adjacent) first outer lead 5a.

Since the first and second inner leads 11a, 11b and the first and second outer leads 5a, 5b in this embodiment are arranged such that their respective edges in the longitudinal direction are in the same position when viewed from the top, the number of inner leads 11 and outer leads 5 formed on a single level is halved, as compared with the case of a planar arrangement in which the same number of inner leads 11 and outer leads 5 are all arranged on a single plane. Thus, the overall width (i.e., the dimension W shown in FIG. 2) of arrangement of these leads can be substantially halved. If the fixed separation for avoiding short-circuiting of the inner leads 11 and outer leads 5 with respective adjacent leads is wider than the width for guaranteeing the strength of these leads themselves, the overall width in the direction of arrangement can be reduced to one half or less, as compared with the conventional planar arrangement.

In FIG. 3, solder resist 14 is a film having insulating properties to prevent penetration of solder. The solder resist 14 also provides insulation between each two adjacent second inner leads 11b and between each two adjacent second outer leads 5b.

Figure 4:
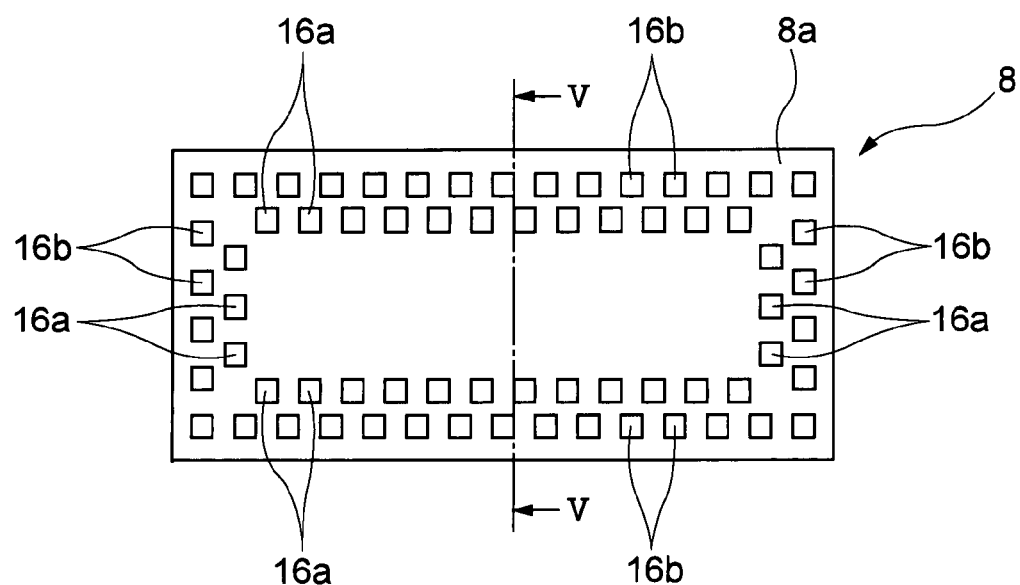
FIG. 4 shows an electrode forming face of a semiconductor chip of Embodiment 1.
Figure 5:
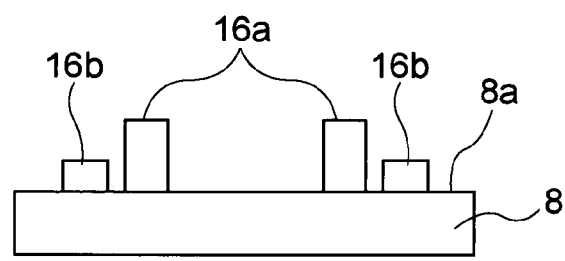
FIG. 5 is a cross-sectional view taken along the line V-V in FIG. 4.

The semiconductor chip 8 has a high density of circuit integration that is twice that of an ordinary semiconductor chip, but is of the same size as an ordinary semiconductor chip. The semiconductor chip 8 is formed with a large number of projecting electrodes on one face thereof (called the electrode forming face 8a) as shown in FIGS. 4 and 5. Specifically, the semiconductor chip 8 is formed with first projecting electrodes 16a and second projecting electrodes 16b (when there is no need to distinguish the leads 16a and 16b, these leads 16a and 16b are referred to in common as projecting electrodes 16) arranged in two rows (or two rectangles) along the peripheral edges of the electrode forming face 8a. The height of the first projecting electrodes 16a formed in the inner row (i.e., inner rectangle), measured from the electrode forming face 8a, is greater than the height of the second projecting electrodes 16b formed in the outer row (i.e., outer rectangle), as shown in FIG. 5.

As shown in FIG. 4, the first projecting electrodes 16a and the second projecting electrodes 16b in this embodiment are arranged in a staggered fashion when viewed from the top. The first inner leads 11a that extend towards the middle of the base film 2 on the chip-mounting face 2a reach the first projecting electrodes 16a and the second inner leads 11b formed on the insulating film 12 reach the second projecting electrodes 16b. The level difference between the first and second inner leads 11a and 11b is equal to (or corresponds to) the height difference between the first and second projecting electrodes 16a and 16b. The first projecting electrodes 16a are joined with the first inner leads 11a, and the second projecting electrodes 16b are joined with the second inner leads 11b (see FIG. 7).

In the manufacture of these first and second projecting electrodes 16a, 16b of different height, when the projecting electrodes are formed of for example gold (Au), the current passage time to the first projecting electrodes 16a in the electrolytic plating step is set to be longer than the current passage time to the second projecting electrodes 16b.

In FIG. 6B, a resist mask 21 is a mask member and has a mask pattern formed by exposure and developing treatment of a positive type or negative type resist that is applied to the chip-mounting face 2a of the base film 2 by photolithography. The resist mask 21 is used as a mask in the step of forming the insulating film 12 in this embodiment.

In FIG. 7C, a sealing layer 23 has insulating properties and is formed by thermosetting a sealing resin such as epoxy resin having thermosetting properties. The sealing resin is poured between the chip-mounting face 2a of the base film 2 and the electrode forming face 8a of the semiconductor chip 8 and cured. The sealing layer 23 is formed while the face opposite the electrode forming face 8a of the semiconductor chip 8 (called the rear face) is being exposed. The sealing layer 12 insulates the joints between the first and second inner leads 11a, 11b and the first and second projecting electrodes 16a, 16b, and protects these joints from external humidity etc.

A semiconductor device 25 (FIG. 7C) is formed by mounting a semiconductor chip 8 on the base film 2 of this embodiment. This manufacturing process will be described below.

A method of manufacturing a tape carrier according to this embodiment is first described below in accordance with the steps P1 to P4 respectively shown in FIG. 6A to FIG. 6D.

Step P1 (FIG. 6A): Copper foil is adhesively laminated onto the chip-mounting face 2a of the base film 2 formed with sprocket holes 3. An etching resist is formed by photolithography covering the region of formation of the first outer leads 5a and first inner leads 11a shown in FIG. 1 and FIG. 2, and the copper foil is then etched using the etching resist as a mask. After this, the etching resist is removed, and the first outer leads 5a and the first inner leads 11a connected therewith are respectively formed in the outer lead forming regions 7a, 7b and inner lead forming region 6 on the chip-mounting face 2a of the base film 2.

Step P2 (FIG. 6B): A resist mask 21 is formed by photolithography covering the region of the tips of the first inner leads 11a and the region of the tips of the first outer leads 5a (the region enclosed by the double-dotted chain line in FIG. 2 and the region outside the region enclosed by the double-dotted chain line in FIG. 1). This resist mask 21 exposes the region of formation of an insulating film 12. The insulating film 12 is formed by coating the leads 11a and 5a with insulating material using the resist mask 21 as a mask.

Insulation between each two adjacent first inner leads 11a and between each two adjacent first outer leads 5a is effected by depositing the insulating film 12 between each two adjacent first inner leads 11a and between each two adjacent first outer leads 5a.

Step P3 (FIG. 6C): The resist mask 21 formed in step P2 is removed. In the same way as in the case of the step P1, copper foil is adhesively laminated onto the insulating film 12. The second outer leads 5b and the second inner leads 11b connected with the leads 5b are respectively formed on the outer lead forming regions 7a, 7b and inner lead forming region 6 on the insulating film 12, using the etching resist covering the region of formation of the second outer leads 5b and second inner leads 11b shown in FIG. 1 and FIG. 2.

Step P4 (FIG. 6D): Liquid solder resist 14 is then applied, with the exception of the tips of the second outer leads 5b and second inner leads 11b, and this liquid is hardened so that the solder resist 14 is formed on the second outer leads 5b and second inner leads 11b except their respective tips. The solder resist 14 extends between each two adjacent second inner leads 11b and between each two adjacent second outer leads 5b.

Insulation between adjacent second inner leads 11b and between adjacent second outer leads 5b is effected by deposition of solder resist 14 between adjacent second inner leads 11b and between adjacent second outer leads 5b.

A method of manufacturing a semiconductor device 25 having a semiconductor chip 8 mounted on the tape carrier 1, which is manufactured in this above-described way, will now be described with reference to the steps PA1 to PA3 shown in FIG. 7A to FIG. 7C.

Step PA1 (FIG. 7A): The rear face of the semiconductor chip 8 is placed on the bonding stage 27, and the first and second inner leads 11a, 11b and the first and second projecting electrodes 16a, 16b are respectively brought up facing each other by moving the inner lead forming region 6 of the tape carrier 1 above the semiconductor chip 8 with the chip-mounting face 2a directed downwards by using the sprocket holes 3, and then stopped.

Step PA2 (FIG. 7B): The face opposite the chip-mounting face 2a of the base film 2 is pressed by a bonding tool 28 so that the first inner leads 11a abut against the first projecting electrodes 16a, and the second inner leads 11b abut against the second projecting electrodes 16b. The first inner leads 11a are joined to the first projecting electrodes 16a and the second inner leads 11b are joined to the second projecting electrodes 16b simultaneously by heating and pressing using the bonding tool 28.

Step PA3 (FIG. 7C): The inner lead forming region 6 of the tape carrier 1 with the chip-mounting face 2a directed upwards is moved into a sealing machine (not shown) using the sprocket holes 3. As shown by the hatching in FIG. 7, sealing resin is poured between the chip-mounting face 2a of the base film 2 and the electrode forming face 8a of the semiconductor chip 8, and this sealing resin is hardened by heating to form a sealing layer 23.

In this way, the semiconductor devices 25 of this embodiment are formed on the tape carrier 1. The semiconductor devices 25 are severed from the tape carrier 1 to obtain individual semiconductor devices 25.

Since the first inner leads 11a of the tape carrier 1 are connected with the first projecting electrodes of large height formed along an inner rectangle near the edge section of the electrode forming face 8a of a semiconductor chip 8, the second inner leads 11b are connected with the second projecting electrodes of lower height formed in an outer rectangle near the edge section of the electrode forming face 8a, the first and second inner leads 11a are formed on two levels with an insulating film 12 therebetween, the first inner leads 11a formed on the chip-mounting face 2a of the base film 2 and the second inner leads 11b on the insulating film 12 can be formed with a width sufficient to provide necessary strength and it is also possible to arrange these leads with a fixed separation such as to avoid short-circuiting with adjacent leads. Therefore, it is feasible to double circuit integration of semiconductor chips 8 while still ensuring sufficient joining strength with the first and second projecting electrodes 16a, 16b of the semiconductor chip 8.

The projecting electrodes 16a and 16b that are formed in two rows (or two rectangles) are higher on the inner side and lower on the outer side, and the first and second inner leads 11a, 11b that are respectively connected with these first and second projecting electrodes 16a, 16b are formed on two levels matching the height difference between the projecting electrodes 16a and 16b with the insulating film 12 interposed. Consequently, the first inner leads 11a can be aligned with the first projecting electrodes 16a while the second inner leads 11b are aligned with the second projecting electrodes 16b, and the first and second inner leads can be joined with the first and second projecting electrodes simultaneously. Thus joining of the first and second projecting electrodes 16a, 16b and the first and second inner leads 11a, 11b of the semiconductor chip 8 can be achieved by a single joining step, and an ordinary joining step using hot pressure fixing can be directly utilized. Thus, the process of manufacturing TCP-type semiconductor devices 25 in which semiconductor chips 8 of high density of circuit integration are mounted can be simplified.

Since the first outer leads 5a are connected on the chip-mounting face 2a with the first inner leads 11a formed on the chip-mounting face 2a of the base film 2 and the second outer leads 5b are connected on the insulating film 12 with the second inner leads 11b formed on the insulating film 12, the first inner leads 11a and first outer leads 5a can be formed on the same plane and the second inner leads 11b and second outer leads 5b can be formed on the same plane. Thus, manufacture of a tape carrier 1 having the first and second inner leads 11a, 11b formed on two levels can easily be achieved. Also, the overall width in the direction of the arrangement of the outer leads 5 can be greatly reduced. This reduces the amount of base film 2 that is used, and reduces the manufacturing costs of the semiconductor devices 25.

Since the tips of the first outer leads 5a extend beyond the tips of the second outer leads 5b on the upper level, joining of the first and second outer leads 5a, 5b with the wiring terminals of the mounting substrate, not shown, can easily be achieved.

As described above, the semiconductor chip of this embodiment has the higher first projecting electrodes formed in the single inner row (or rectangle) on the electrode forming face and the lower second projecting electrodes formed in the outer row, and the first and second projecting electrodes are arranged in the staggered fashion. The base film has the first inner leads extending on the chip-mounting face and reaching over the first projecting electrodes and the second inner leads extending on the insulating film and reaching over the second projecting electrodes, sandwiching the insulating film formed on the first inner leads. As a result, the first and second projecting electrodes of the semiconductor chips and the first and second inner leads on the base film can be simultaneously joined. Thus a single joining step suffices, thereby making it possible to simplify the joining step for the semiconductor devices which have semiconductor chips of a high level of circuit integration.

By forming the first outer leads, which will be connected with the first inner leads, on the chip-mounting face of the base film, forming the second outer leads, which will be connected with the second inner leads, on the insulating film, and extending the tips of the first outer leads beyond the tips of the second outer leads, the first inner leads and first outer leads can be formed on the same face and the second inner leads and second outer leads can be formed on the same face. Therefore, it is possible to easily manufacture a tape carrier having first and second inner leads formed on two levels, and to greatly reduce the overall width in the direction of arrangement of the outer leads. It is also possible to easily perform joining of the first and second outer leads with the wiring terminals of the mounting substrate.

Embodiment 2

Figure 8:
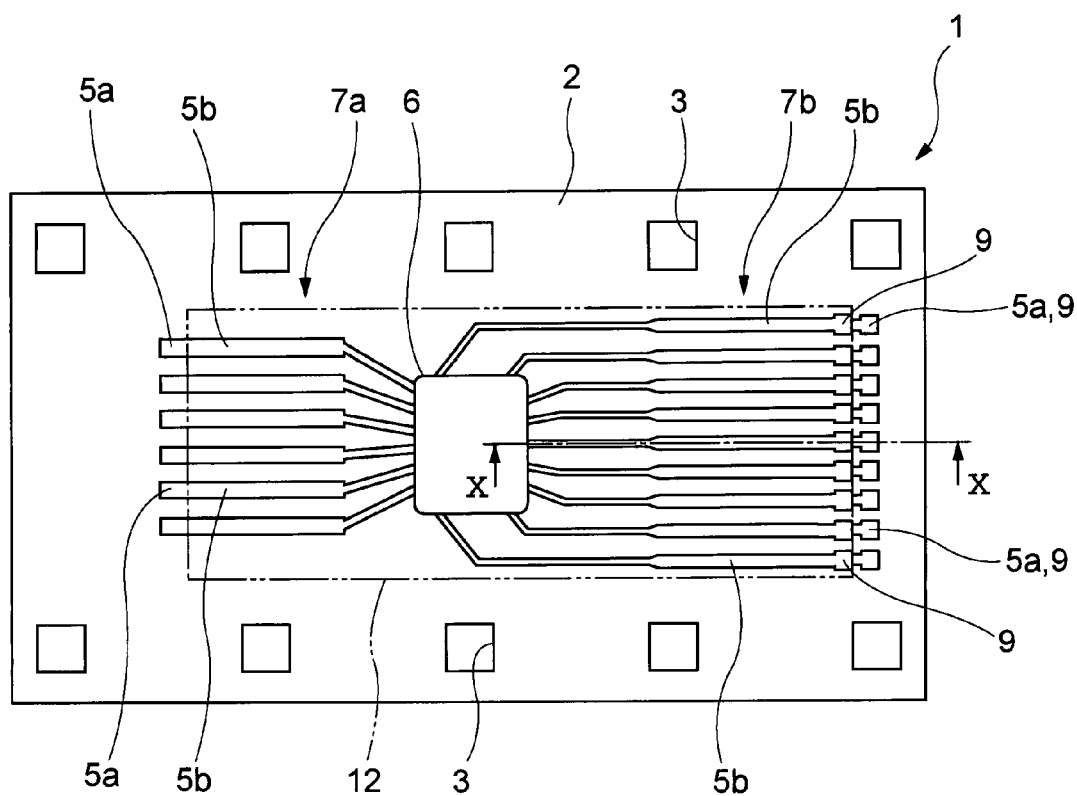
FIG. 8 illustrates a top view of a tape carrier according to Embodiment 2 of the present invention.
Figure 9:
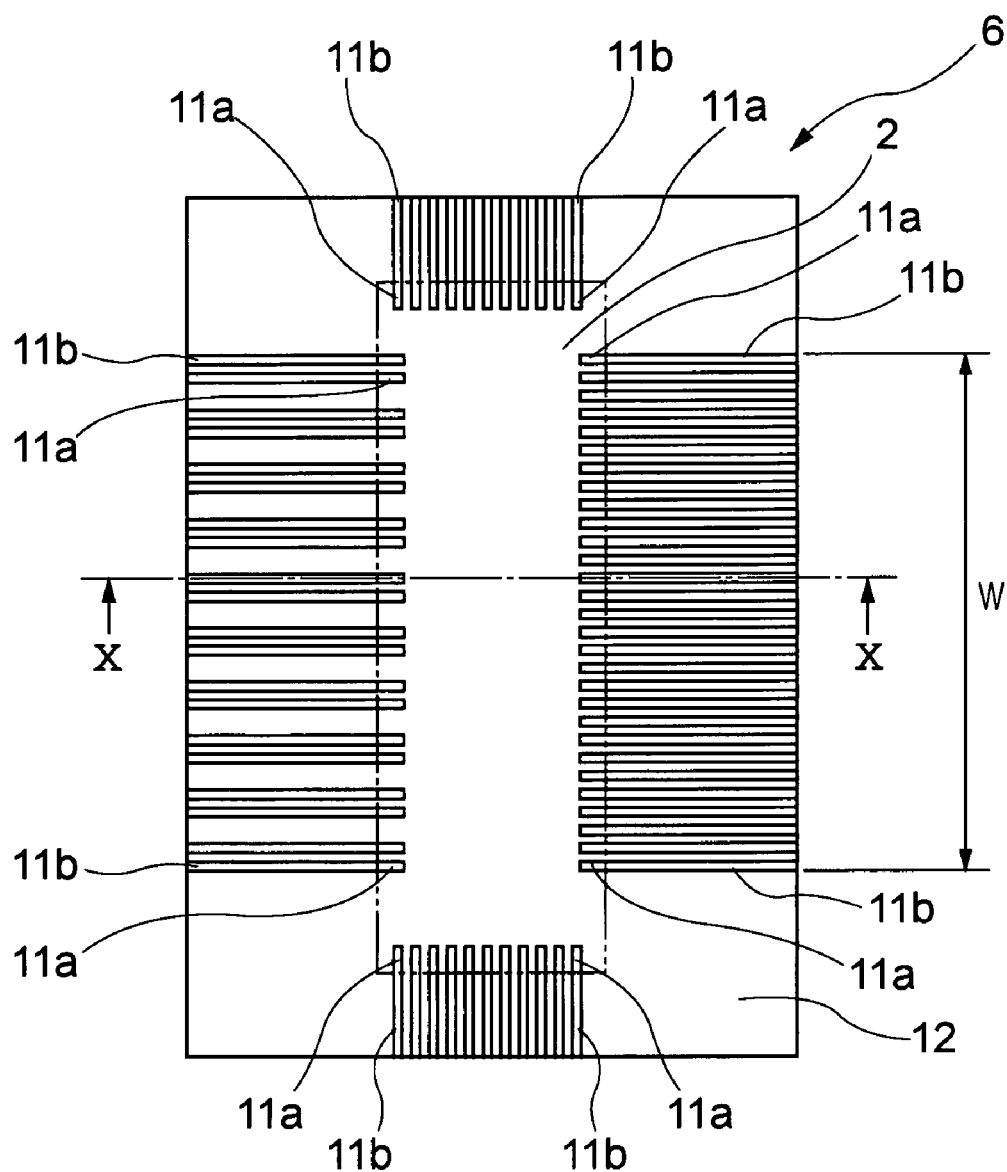
FIG. 9 shows a top view of an inner lead forming region according to Embodiment 2.
Figure 10:
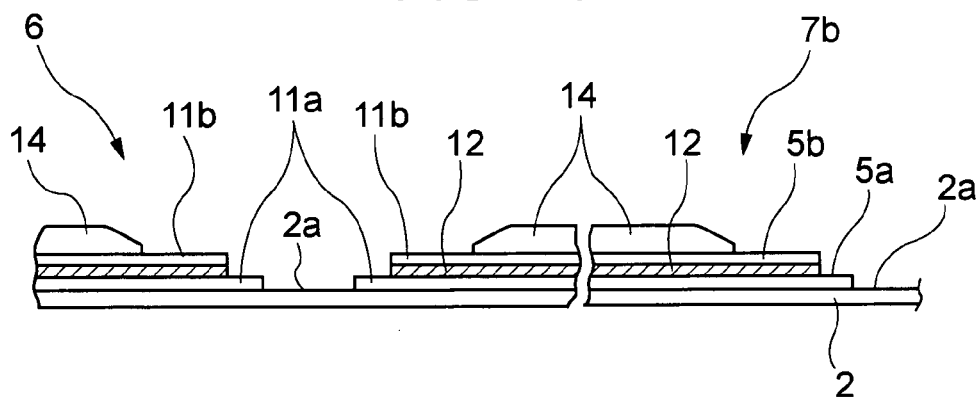
FIG. 10 is a cross-sectional view of a tape carrier, taken along the line X-X in FIG. 8 or 9.
Figure 11:
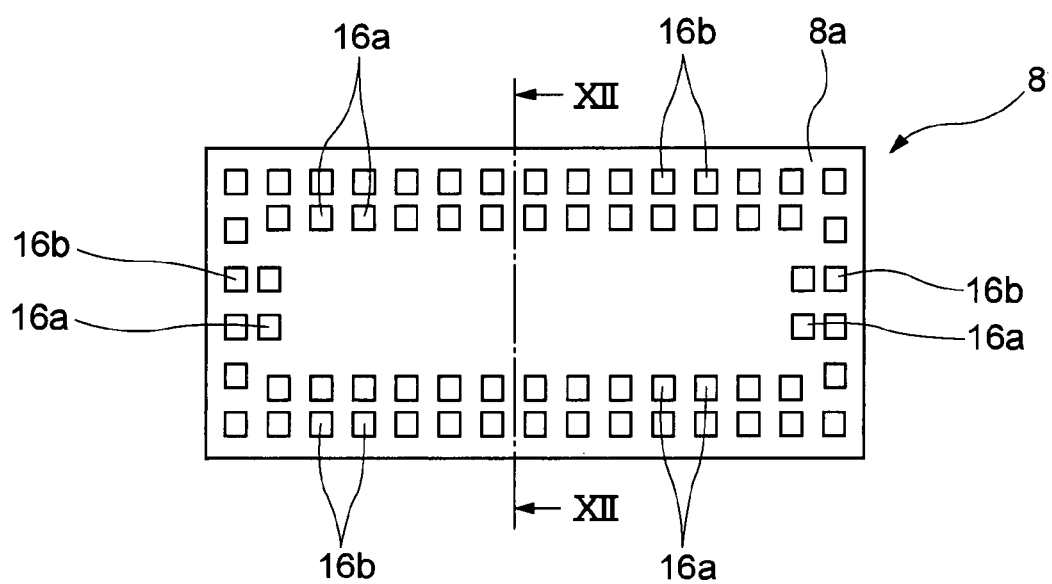
FIG. 11 shows an electrode forming face of a semiconductor chip according to Embodiment 2.
Figure 12:
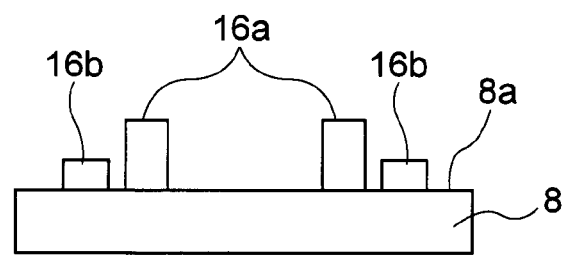
FIG. 12 shows a cross-sectional view taken along the line XII-XII in FIG. 11.

Embodiment 2 of the present invention will be described with reference to FIGS. 8 to 12. FIG. 8 illustrates the upper surface of a tape carrier. FIG. 9 shows the upper surface of an inner lead forming region. FIG. 10 is a cross-sectional view of a tape carrier. FIG. 11 shows an electrode forming face of the semiconductor chip. FIG. 12 is a cross-sectional view taken along the line XII-XII of FIG. 11.

FIG. 10 is a cross-sectional view taken along the line X-X in FIG. 9 or the lines X-X in FIG. 8. It should be noted that FIGS. 8 and 9 show the condition in which the solder resist is removed.

Parts which are similar or identical with corresponding parts in Embodiment 1 are given the same reference symbols and numerals, and redundant description thereof is dispensed with.

The first and second inner leads 11a, 11b and the first and second outer leads 5a, 5b of this embodiment are arranged (see FIG. 10) on two levels sandwiching the insulating film 12 in the same way as in Embodiment 1. However, the first inner leads 11a and second inner leads 11b are arranged (see FIG. 9) such that the two longitudinal sides of each second inner lead 11b overlap the two longitudinal sides of each (or corresponding) first inner lead 11a when viewed from the top. That is, as shown in FIG. 10, the second inner leads 11b extend above the first inner leads 11a in the overlapping manner, with the insulating film 12 therebetween. Also, the second outer leads 5b and first outer leads 5a extend in the overlapping manner, with the insulating film 12 therebetween, as shown in FIG. 8.

Similar to Embodiment 1, this arrangement of Embodiment 2 halves the number of inner leads 11 and outer leads 5 formed on one level as compared with the case of a planar arrangement, thereby reducing the overall width of the lead section (the dimension W shown in FIG. 9) in the direction of arrangement to a substantially half. The overall width of the outer and inner leads 11a, 11b is reduced to less than half if the spacing between the inner leads 11 and outer leads 5 for avoiding short-circuiting with adjacent leads is wider than the width of the individual lead that is necessary for guaranteeing the strength of the leads themselves.

A semiconductor chip 8 according to this embodiment is a semiconductor chip with an increased degree of circuit integration (i.e., twice that of an ordinary semiconductor chip) but the same size, as in Embodiment 1. However, as shown in FIG. 11, the first and second projecting electrodes 16a and 16b arranged in series along the long side of the semiconductor chip 8 are positioned side by side (not staggered) and the first projecting electrodes 16a and second projecting electrodes 16b arranged along the short side of the semiconductor chip 8 are also positioned side by side. Like Embodiment 1, the first projecting electrodes 16a arranged inside are higher than the second projecting electrodes 16b arranged outside (see FIG. 12). The first inner leads 11a formed on the chip-mounting face 2a of the base film 2 are joined with the first projecting electrodes 16a and the second inner leads 11b formed on the insulating film 12 are joined with the second projecting electrodes 16b.

The manufacture of the semiconductor device 25 formed with the semiconductor chip 8 mounted on the base film 2 in this embodiment is similar to Embodiment 1 (see the method of manufacture of the tape carrier shown in FIG. 6 and the method of manufacture of the semiconductor device shown in FIG. 7). Thus, description thereof is dispensed with.

The formation of the second outer leads 5b and second inner leads 11b in the step P3 of Embodiment 1 is achieved using an etching resist that covers the region of formation of the second outer leads 5b and second inner leads 11b shown in FIGS. 8 and 9.

As described above, this embodiment can demonstrate the same benefits as in the case of Embodiment 1 even when the first and second projecting electrodes of the semiconductor chip are formed side by side along the edge of the electrode forming face and the base film has the first and second inner leads overlapping in two levels and sandwiching the insulating film.

It should be noted that, although the first and second embodiments deals with a case in which the two rows of projecting electrodes 11a, 11b of the semiconductor chip are arranged in a staggered fashion and a case in which two rows of projecting electrodes 11a, 11b are arranged side by side, the arrangement of the two rows of projecting electrodes 11a, 11b could be an arrangement intermediate between a staggered arrangement and a side-by-side arrangement, or could be an irregular arrangement. So long as the first and second inner leads are formed in two levels matching the arrangement of the two rows of projecting electrodes of the semiconductor chip, the same advantages as described above can be obtained.

Although the insulating film is made of polyimide in the above-described embodiments, solder resist may be used as the insulating film.

This application is based on Japanese Patent Application No. 2006-158900 filed on Jun. 7, 2006 and the entire disclosure thereof is incorporated herein by reference.

What is claimed is:

1. A semiconductor device comprising:
    a semiconductor chip having a first face and an edge;
    an insulating base film which has a semiconductor chip mounting face, the semiconductor chip mounting face facing the first face of the semiconductor chip with predetermined spacing;
    a plurality of first projecting electrodes formed in a first row on the first face of the semiconductor chip along the edge of the semiconductor chip;
    a plurality of second projecting electrodes formed in a second row on the first face of the semiconductor chip along the edge of the semiconductor chip, the plurality of second projecting electrodes being located between the edge of the semiconductor chip and the first row of first projecting electrodes, and a height of said second projecting electrode being smaller than a height of said first projecting electrode;
    a plurality of first inner leads extending on the semiconductor chip mounting face of the base film such that the plurality of first inner leads reach said plurality of first projecting electrodes respectively;
    an insulating film between the first inner leads and the first face of the semiconductor chip; and
    a plurality of second inner leads extending between the insulating film and the first face of the semiconductor chip such that the plurality of second inner leads reach said plurality of second projecting electrodes respectively,
    wherein the first and second inner leads are disposed on the same side of the insulating base film.

2. The semiconductor device according to claim 1, wherein said plurality of first projecting electrodes and said plurality of second projecting electrodes are arranged in a staggered fashion.

3. The semiconductor device according to claim 1, wherein said plurality of first projecting electrodes and said plurality of second projecting electrodes are arranged side by side respectively.

4. The semiconductor device according to claim 1, further comprising:
    a plurality of first outer leads connected with said plurality of first inner leads respectively, and formed on the semiconductor chip mounting face of the base film outside the first and second inner leads; and
    a plurality of second outer leads connected with said plurality of second inner leads respectively, and formed on said insulating film, wherein tips of the first outer leads extend beyond tips of the second outer leads.

5. The semiconductor device according to claim 1, wherein the insulating film is solder resist.

6. The semiconductor device according to claim 1, wherein the base film has a plurality of first sprocket holes formed along a first longitudinal side thereof and a plurality of second sprockets holes formed along a second longitudinal side thereof.

7. The semiconductor device according to claim 1, wherein the second inner leads overlap the first inner leads with the insulating film being interposed therebetween.

8. A semiconductor device comprising:
    a semiconductor chip having a first face and an edge;
    an insulating base film which has a semiconductor chip mounting face, the semiconductor chip mounting face facing the first face of the semiconductor chip with predetermined spacing;
    a plurality of first projecting electrodes formed in a first row on the first face of the semiconductor chip along the edge of the semiconductor chip;
    a plurality of second projecting electrodes formed in a second row on the first face of the semiconductor chip along the edge of the semiconductor chip, the plurality of second projecting electrodes being located between the edge of the semiconductor chip and the first row of first projecting electrodes, and a height of said second projecting electrode being smaller than a height of said first projecting electrode;
    a plurality of first inner leads extending on the semiconductor chip mounting face of the base film such that the plurality of first inner leads reach said plurality of first projecting electrodes respectively;
    an insulating film between the first inner leads and the first face of the semiconductor chip; and
    a plurality of second inner leads extending between the insulating film and the first face of the semiconductor chip such that the plurality of second inner leads reach said plurality of second projecting electrodes respectively,
    wherein the insulating film and the insulating base film are two separate elements, and the insulating film is disposed between the insulating base film and the semiconductor chip.

9. The semiconductor device according to claim 8, wherein said plurality of first projecting electrodes and said plurality of second projecting electrodes are arranged in a staggered fashion.

10. The semiconductor device according to claim 8, wherein said plurality of first projecting electrodes and said plurality of second projecting electrodes are arranged side by side respectively.

11. The semiconductor device according to claim 8, further comprising:
    a plurality of first outer leads connected with said plurality of first inner leads respectively, and formed on the semiconductor chip mounting face of the base film outside the first and second inner leads; and
    a plurality of second outer leads connected with said plurality of second inner leads respectively, and formed on said insulating film, wherein tips of the first outer leads extend beyond tips of the second outer leads.

12. The semiconductor device according to claim 8, wherein the insulating film is solder resist.

13. The semiconductor device according to claim 8, wherein the base film has a plurality of first sprocket holes formed along a first longitudinal side thereof and a plurality of second sprockets holes formed along a second longitudinal side thereof.

14. The semiconductor device according to claim 8, wherein the second inner leads overlap the first inner leads with the insulating film being interposed therebetween.

* * * * *